United States Patent
Fuse et al.

[11] Patent Number: 5,973,820
[45] Date of Patent: Oct. 26, 1999

[54] FM MODULATION DEVICE

[75] Inventors: Masaru Fuse, Toyonaka; Kuniaki Utsumi, Sanda; Seiichiro Kawashima, Yokohama; Koji Kikushima, Ichikawa, all of Japan

[73] Assignees: Matsushita Electric Industrial Co., Ltd., Osaka; Nippon Telegraph and Telephone Corporation, Tokyo, both of Japan

[21] Appl. No.: 09/080,312

[22] Filed: May 18, 1998

[30] Foreign Application Priority Data

May 19, 1997 [JP] Japan .................................. 9-128972

[51] Int. Cl.⁶ ...................................................... G02F 1/23
[52] U.S. Cl. ............................................. 359/278; 359/238
[58] Field of Search ..................................... 359/237, 238, 359/278

[56] References Cited

U.S. PATENT DOCUMENTS

| | | | |
|---|---|---|---|
| 4,662,715 | 5/1987 | Shutterly | 359/278 |
| 4,726,644 | 2/1988 | Mathis | 359/238 |
| 4,824,201 | 4/1989 | Kazovsky | 359/238 |

OTHER PUBLICATIONS

K. Kikushima et al. "150–km Non–Repeated 60–channel AM–Video Transmission Employing Optical Heterodyne AM/FM Converter", ECOC '95, Th.L.3.1, Brussels, 1995, pp. 1047–1050.

*Primary Examiner*—Loha Ben
*Attorney, Agent, or Firm*—Wenderoth, Lind & Ponack, L.L.P.

[57] ABSTRACT

A branch portion 107 branches a modulating signal into two signals in opposite phases. One of them is inputted to an FM laser element 102. The other one is adjusted in propagation delay and in amplitude and then is inputted to an IM suppressing laser element 110. The FM laser element 102 outputs an optical-frequency-modulated signal around a wavelength $\lambda 1$, whose optical intensity is also modulated. A local light source 104 outputs light at a wavelength $\lambda 0$, which is different from the oscillation wavelength $\lambda 1$ of the FM laser element 102 by $\Delta\lambda$. The IM suppressing laser element 110 outputs an optical-intensity-modulated signal. The three lights are combined and inputted to a photodetection portion 106. The photodetection portion 106 applies a heterodyne detection to inputted lights to output an FM modulated signal corresponding to a beat signal of the outputted optical signal from the FM laser element 102 and the outputted light from the local light source 104 at frequency corresponding to the difference $\Delta\lambda$ between the original two wavelengths, and also cancels the average-value variation component in the FM modulated signal with an electrical signal produced by square-law detecting the optical-intensity-modulated signal from the IM suppressing laser element 110, thereby producing an ideal FM modulated signal.

8 Claims, 6 Drawing Sheets

HETERODYNE DETECTION OUTPUT RESULTING FROM
FM LASER OUTPUT LIGHT AND LOCAL LIGHT

DIRECT DETECTION OUTPUT RESULTING FROM
IM SUPPRESSING LASER OUTPUT LIGHT

OUTPUT SIGNAL FROM PHOTODETECTION PORTION

WAVEFORM AND SPECTRUM OF PURE FM SIGNAL

WAVEFORM AND SPECTRUM OF FM MODULATED AND IM MODULATED SIGNAL (FM+IM SIGNAL)

WAVEFORM AND SPECTRUM OF FM+IM SIGNAL WITH IM-DD COMPONENT (DC COMPONENT VARYING WITH IM-DD COMPONENT)

Vref

FM MODULATION DEVICE

BACKGROUND OF THE INVENTION

1. Field of the Invention

The present invention relates to FM modulation devices, and more particularly to a modulation device that produces wider-band frequency-modulated signal (hereinafter referred to as FM modulated signal) by using a semiconductor laser element.

2. Description of the Background Art

FIG. 3 is a block diagram showing a structure of a conventional FM modulation device. In FIG. 3, the conventional FM modulation device includes a signal source 301, a laser element for FM modulation (hereinafter referred to as an FM laser element) 302, a first optical waveguide portion 303, a local light source 304, a second optical waveguide portion 305, and a photodetection portion 306. The structure and operation of this conventional FM modulation device will now be described in detail.

The signal source 301 outputs an electrical signal as the original signal for FM modulation. The FM laser element 302 is formed of a semiconductor laser element, for example. With constant injection current, it oscillates light at a wavelength $\lambda 1$. When the injection current is amplitude-modulated, its outputted light is modulated in intensity and also in oscillation wavelength (optical frequency), and it outputs optical-frequency-modulated signal around the wavelength $\lambda 1$. The first optical waveguide portion 303 guides the optical signal outputted from the FM laser element 302. The local light source 304 outputs light at a wavelength $\lambda 0$, which is different from the oscillation wavelength $\lambda 1$ of the FM laser element 302 by a given quantity $\Delta \lambda$. The second optical waveguide portion 305 guides the unmodulated light from the local light source 304. The two lights guided by the first and second optical waveguide portions 303 and 305 are combined and inputted to the photodetection portion 306. The photodetection portion 306 is formed of a photodiode having a square-law detection characteristic, for example. It has the property of outputting variations in optical intensity of the inputted light as variations in current amplitude (hereinafter referred to as IM-DD components), and it also has the property of, when two lights of different wavelengths are inputted thereto, producing a beat component of the two lights at a frequency corresponding to the wavelength difference (this operation is called a heterodyne detection). Accordingly, the photodetection portion 306 outputs the beat signal of the outputted optical signal from the FM laser element 302 and the outputted light from the local light source 304 at a frequency corresponding to the wavelength difference $\Delta \lambda$ between the two lights. This beat signal is an FM modulated signal resulting from the original electrical signal from the signal source 301.

As described above, the FM modulation device that converts an electrical signal into an optical-frequency-modulated signal by utilizing the characteristic that a semiconductor laser element, for example, varies its oscillation wavelength in accordance with the injection current (called wavelength chirp), and further converting it into an electrical signal by an optical heterodyne detection can easily realize wide-band FM modulation performance with very large frequency deviation, such as cannot be realized with popular electric modulation devices, through the use of appropriate FM laser element 302 and local light source 304. This enables FM modulation to wide-band signals, like multi-channel frequency-division-multiplexed signals used in CATV etc.

Currently, the CATV most generally uses the AM (Amplitude Modulation) transmission system. This method requires the transmission method to present a very good noise characteristic (e.g., SNR: 51 dB or higher). On the other hand, the FM (Frequency Modulation) transmission method has the advantage that it does not require a very good noise characteristic, unlike the AM transmission method, although it requires a wider transmission band. Accordingly, when AM-FDM (Frequency Division Multiplex) signal currently used in CATV is simultaneously converted into an FM signal by using an FM modulation device having the above structure and then transmitted, the AM signal requiring high SNR can be transmitted through a transmission line with inferior noise characteristic. (For example, refer to K. Kikushima et al., "150-km Non-Repeated 60-Channel AM-Video Transmission Employing Optical Heterodyne AM/FM Converter," ECOC'95, Th.L.3.1, Brussels, 1995.)

However, since the outputted optical signal from the FM laser element 302 contains an optical intensity modulation component, the FM modulated signal produced by the FM modulation device shown in FIG. 3 contains not only a frequency variation but also an average-value variation component, which considerably deteriorates signal quality in FM demodulation. This problem will now be described in detail.

FIG. 4 is a schematic diagram showing relations between spectral shapes and waveforms of the wide-band FM modulated signal produced in a conventional FM modulation device. It is assumed here that the signal source 301 outputs a frequency-division-multiplexed multi-channel signal as the original signal for FM modulation. When the optical signal outputted from the FM laser element 302 has only the optical frequency modulation component, the produced wide-band FM modulated signal is an ideal FM modulated signal as shown in FIG. 4(a), whose spectrum is in a symmetrical shape about the carrier at the frequency fc corresponding to the difference in oscillation wavelength between the FM laser element 302 and the local light source 304, ($\lambda 1 - \lambda 0$). On the other hand, as has been explained referring to FIG. 3, when the optical signal outputted from the FM laser element 302 is modulated not only in optical frequency but also in optical intensity (IM modulation), the waveform of the modulated signal contains the amplitude variation (IM modulation component) as shown in FIG. 4(b) (a signal like this is called an FM+IM signal, hereinafter), whose spectral shape is not symmetrical. Further, in the conventional FM modulation device shown in FIG. 3, the optical intensity modulation component is square-law-detected in the photodetection portion 306, and the component (IM-DD component) is superimposed upon the FM modulated signal. Then, as shown in FIG. 4(c), the average-value level of the generated FM+IM signal will vary with the IM-DD component.

Described next is the waveform deterioration caused in FM demodulation when the FM modulated signal contains the average-value variation. FIG. 5 shows a typical structure of a demodulation circuit for wide-band FM modulated signal. This diagram also shows waveforms which will be presented in individual portions when an ideal FM modulated signal is inputted to this FM demodulation circuit.

In FIG. 5, the FM demodulation circuit includes a discrimination portion 501, a delay portion 502, an AND gate 503, and a low-pass filter (LPF) 504. The discrimination portion 501 is formed of logic element, such as AND gate, for example. It discriminates the inputted FM modulated signal with a given threshold Vref to convert (to pulse) the FM modulated signal into a pulse signal (logic signal). The discrimination portion 501 has two output ports. One of its outputted signals is directly inputted to the AND gate 503, and the other one is delayed by a given quantity in the delay portion 502 and then inputted to the AND gate 503. The AND gate 503 produces AND signal of the two inputted pulse signals. The LPF 504 passes only the low-frequency components in the outputted signal from the AND gate 503. The amplitude variation component obtained in this way uniquely corresponds to the frequency variation component in the inputted FM modulated signal. The FM modulated signal can thus be demodulated.

However, as stated above, the conventional FM modulation device cannot produce an ideal FM modulated signal. It outputs an FM modulated signal that contains average-value variation (IM-DD component). Accordingly, when the inputted FM modulated signal is discriminated with a given fixed threshold Vref as in the FM demodulation circuit shown in FIG. 5, it is difficult to correctly discriminate the signal, as can be seen from FIG. 6. Then the demodulated signal will provide deteriorated waveform.

As described above, the FM modulation device with the structure shown in FIG. 3 has its unique problem that the IM-DD component generated by the photodetection portion 306 and superimposed upon the wide-band FM modulated signal decreases the discriminating accuracy in FM demodulation and causes waveform deterioration. In other words, when a wide-band FM modulated signal is produced by utilizing the optical frequency modulating operation by a semiconductor laser element and the heterodyne detection, optical intensity modulation is produced as well as optical frequency modulation, which causes average-value variation in the wide-band FM modulated signal. Then FM demodulation cannot be correctly performed.

SUMMARY OF THE INVENTION

Accordingly, an object of the present invention is to provide an FM modulation device that can remove the average-value variation component in a beat signal produced by an optical frequency modulation operation of a semiconductor laser element and a heterodyne detection, i.e., a wide-band FM modulated signal, to prevent waveform deterioration in FM demodulation The present invention has the following characteristics to achieve the object above.

A first aspect of the present invention is directed to an FM modulation device comprising:

a signal source for outputting an electrical signal;

a branch portion for branching the electrical signal outputted from the signal source into a first electrical signal and a second electrical signal, the first electrical signal and the second electrical signal being set in opposite phases to each other;

a laser light source for FM modulation (hereinafter referred to as an FM laser element) having the property of oscillating a light at a wavelength $\lambda 1$ in a steady state in which its inputted electrical signal remains constant, and also the property of uniquely converting a variation in amplitude of the inputted electrical signal into a variation in optical intensity and also uniquely into a variation in optical frequency, for converting the first electrical signal supplied as the inputted electrical signal into a optical signal and outputting the optical signal;

a first optical waveguide portion for guiding the optical signal outputted from the FM laser element;

a local light source for outputting a light at a wavelength $\lambda 0$ which is different from the oscillation wavelength $\lambda 1$ of the FM laser element by $\Delta\lambda$;

a second optical waveguide portion for guiding the light outputted from the local light source;

a laser light source for suppressing IM-DD component (hereinafter referred to as an IM suppressing laser element) having the property of uniquely converting a variation in amplitude of its inputted electrical signal into a variation in optical intensity, for converting the second electrical signal supplied as the inputted electrical signal into a optical signal having a wavelength $\lambda 2$ and outputting the optical signal;

a third optical waveguide portion for guiding the optical signal outputted from the IM suppressing laser element; and a photodetection portion having the property of converting and outputting a variation in optical intensity of its inputted light as a variation in output current by a square-law detection characteristic (hereinafter referred to as IM-DD component), and also the property of, when two lights having different wavelengths are inputted, producing a beat component of the two lights at a frequency corresponding to a difference in wavelength between the two lights, for converting an optical intensity modulation component in the optical signal outputted from the FM laser element and the optical-intensity-modulated signal outputted from the IM suppressing laser element individually into variations in amplitude of the output current, and also outputting a beat signal of the optical signal outputted from the FM laser element and the light outputted from the local light source at a frequency corresponding to the wavelength difference $\Delta\lambda$ between the two lights.

According to a second aspect of the present invention, the FM modulation device according to the first aspect further comprises, a delay adjusting portion for adjusting the quantity of delay of at least one of the first and second electrical signals so that the propagation delay required for the first electrical signal outputted from the branch portion to enter the FM laser element, propagate through the first optical waveguide portion as the optical signal, and reach the photodetection portion, and the propagation delay required for the second electrical signal outputted from the branch portion to enter the IM suppressing laser element, propagate through the third optical waveguide portion as the optical signal, and reach the photodetection portion are equal to each other; and an amplitude adjusting portion for adjusting the amplitude of at least one of the first and second electrical signals so that the magnitude of the optical intensity modulation component in the optical signal outputted from the FM laser element and the magnitude of the optical-intensity-modulated signal outputted from the IM suppressing laser element are equal to each other in the outputted signal amplitude from the photodetection portion.

According to a third aspect of the present invention, in the FM modulation device of the first aspect, a power coupling ratio of the optical signal outputted from the FM laser element and the optical signal outputted from the IM suppressing laser element, which are inputted to the photodetection portion, is set to n:1 (where n is a given positive real number), and the IM suppressing laser element has an optical intensity modulation index set to be n times the optical intensity modulation index of the FM laser element.

According to a fourth aspect of the present invention, in the FM modulation device according to the second aspect, a power coupling ratio of the optical signal outputted from the FM laser element and the optical signal outputted from the IM suppressing laser element, which are inputted to the photodetection portion, is set to n:1 (where n is a given positive real number), and the IM suppressing laser element has an optical intensity modulation index set to be n times the optical intensity modulation index of the FM laser element.

According to a fifth aspect of the present invention, in the FM modulation device of the first aspect, the oscillation wavelength λ2 of the IM suppressing laser element is sufficiently deviated from the oscillation wavelength λ1 of the FM laser element and the oscillation wavelength λ0 of the local light source so that a beat frequency resulting from the optical signal outputted from the IM suppressing laser element and the optical signal outputted from the FM laser element, and a beat frequency resulting from the optical signal outputted from the IM suppressing laser element and the light outputted from the local light source do not coincide with the beat frequency resulting from the optical signal outputted from the FM laser element and the light outputted from the local light source at least.

According to a sixth aspect of the present invention, in the FM modulation device of the second aspect, the oscillation wavelength λ2 of the IM suppressing laser element is sufficiently deviated from the oscillation wavelength λ1 of the FM laser element and the oscillation wavelength λ0 of the local light source so that a beat frequency resulting from the optical signal outputted from the IM suppressing laser element and the optical signal outputted from the FM laser element, and a beat frequency resulting from the optical signal outputted from the IM suppressing laser element and the light outputted from the local light source do not coincide with the beat frequency resulting from the optical signal outputted from the FM laser element and the light outputted from the local light source at least.

According to a seventh aspect of the present invention, in the FM modulation device of the third aspect, the oscillation wavelength λ2 of the IM suppressing laser element is sufficiently deviated from the oscillation wavelength λ1 of the FM laser element and the oscillation wavelength λ0 of the local light source so that a beat frequency resulting from the optical signal outputted from the IM suppressing laser element and the optical signal outputted from the FM laser element, and a beat frequency resulting from the optical signal outputted from the IM suppressing laser element and the light outputted from the local light source do not coincide with the beat frequency resulting from the optical signal outputted from the FM laser element and the light outputted from the local light source at least.

According to an eighth aspect of the present invention, in the FM modulation device of the fourth aspect, the oscillation wavelength λ2 of the IM suppressing laser element is sufficiently deviated from the oscillation wavelength λ1 of the FM laser element and the oscillation wavelength λ0 of the local light source so that a beat frequency resulting from the optical signal outputted from the IM suppressing laser element and the optical signal outputted from the FM laser element, and a beat frequency resulting from the optical signal outputted from the IM suppressing laser element and the light outputted from the local light source do not coincide with the beat frequency resulting from the optical signal outputted from the FM laser element and the light outputted from the local light source at least.

In any of the first to eighth aspects, the electrical signal outputted from the signal source is split into two and the two signals are set to be in opposite phases to each other. One of the signals is inputted to the FM laser element, and the other one is used to optical-intensity-modulate the IM suppressing laser element. The signals are then inputted to the photodetection portion together with the unmodulated light from the local light source. Then the average-value variation component in the wide-band FM modulated signal outputted from the photodetection portion, i.e., the component obtained by square-law detecting the optical intensity modulation component in the optical signal outputted from the FM laser element (IM-DD component), can be cancelled by the electrical signal obtained by square-law detecting the optical-intensity-modulated signal from the IM suppressing laser element. This enables generation of a wide-band FM modulated signal with reduced average-value variation component.

In the second aspect above, the quantities of propagation delays required for the first and second electrical signals outputted from the branch portion to propagate through the respective propagation paths to reach the photodetection portion coincide with each other, and the magnitude of the average-value variation component in the wide-band FM modulated signal and the amplitude of the signal obtained by square-law detection to the optical-intensity-modulated signal from the IM suppressing laser element coincide with each other in the photodetection portion. This allows the average-value variation component in the wide-band FM modulated signal to be more certainly cancelled in the photodetection portion, thus producing a wide-band FM modulated signal without average-value variation.

In the third and fourth aspects above, the relation between the power ratio between the optical signal from the FM laser element and the optical signal from the IM suppressing laser element inputted to the photodetection portion and the optical intensity modulation indexes at the FM laser element and the IM suppressing laser element is clearly defined, so that the magnitude of the average-value variation component in the wide-band FM modulation signal and the signal amplitude obtained by square-law-detecting the optical-intensity-modulated signal from the IM suppressing laser element can more accurately coincide in the output from the photodetection portion. As a result, the average-value variation component in the wide-band FM modulation signal can be more certainly cancelled in the photodetection portion, and an ideal wide-band FM modulated signal can be obtained without average-value variation.

In the fifth to eighth aspects, the oscillation wavelength of the IM suppressing laser element is set to be sufficiently different from the oscillation wavelengths of the FM laser element and the local light source, which prevents the beat signal produced between the IM suppressing laser element and the FM laser element, or between the IM suppressing laser element and the local light source from interfering with the wide-band FM modulated signal, i.e., the beat signal produced between the FM laser element and the local light source, to produce a wide-band FM modulated signal of good quality.

These and other objects, features, aspects and advantages of the present invention will become more apparent from the following detailed description of the present invention when taken in conjunction with the accompanying drawings.

DESCRIPTION OF THE PREFERRED EMBODIMENTS (1) First Embodiment

Figure 1:
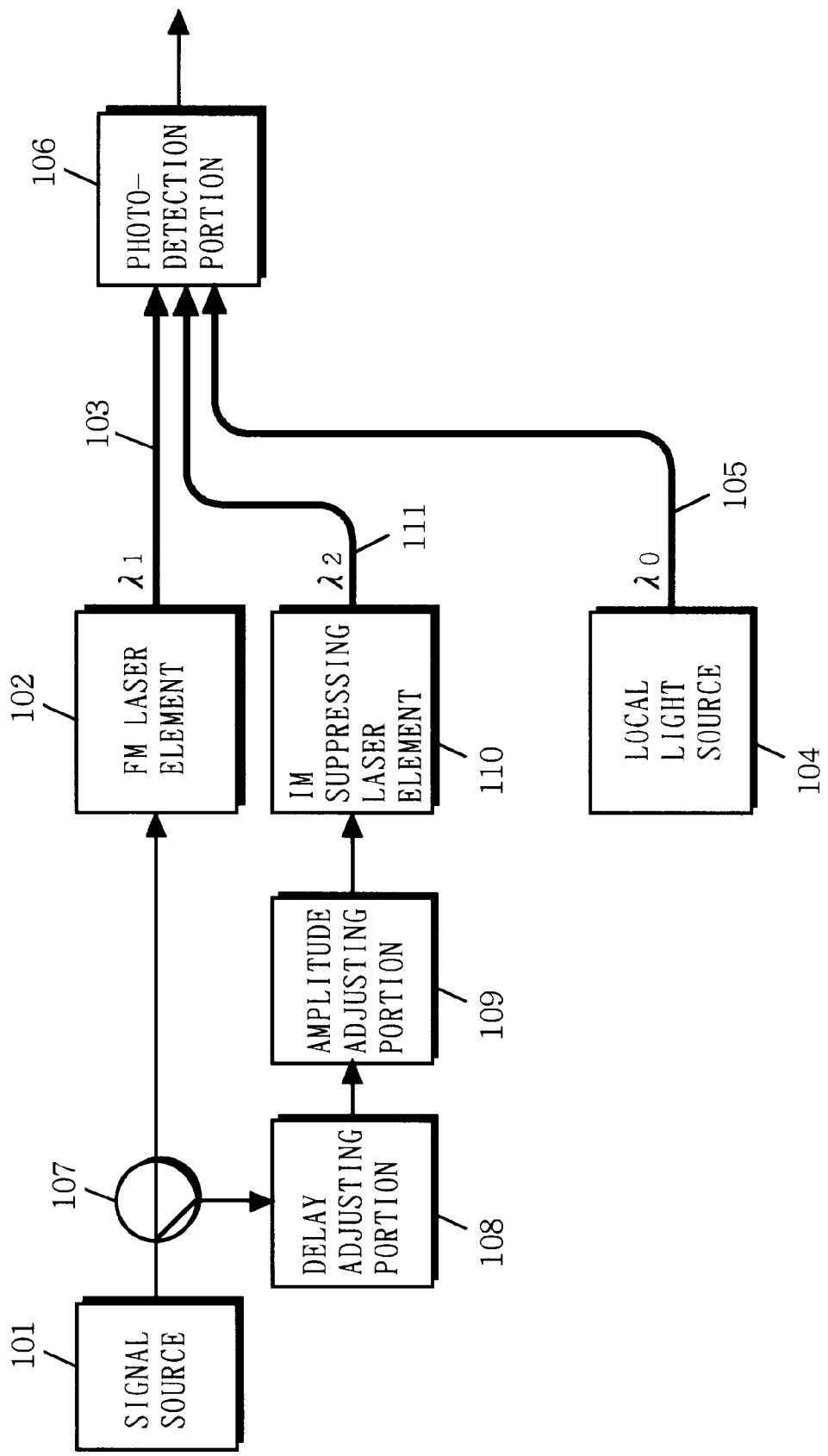
FIG. 1 is a block diagram showing the structure of an FM modulation device according to a first embodiment of the present invention.

FIG. 1 is a block diagram showing the structure of an FM modulation device according to a first embodiment of the present invention. In FIG. 1, the FM modulation device of this embodiment includes a signal source 101, a laser element for FM modulation (hereinafter referred to as an FM laser element) 102, a first optical waveguide portion 103, a local light source 104, a second optical waveguide portion 105, a photodetection portion 106, a branch portion 107, a delay adjusting portion 108, an amplitude adjusting portion 109, a laser element for suppressing IM component (hereinafter referred to as an IM suppressing laser element) 110, and a third optical waveguide portion 111. Operation of the FM modulation device of the first embodiment having the structure above will now be described.

The signal source 101 outputs an electrical signal as the original signal for FM modulation. The branch portion 107 branches the electrical signal outputted from the signal source 101 into two, and outputs one of them as a first electrical signal to the FM laser element 102 and the other as a second electrical signal to the delay adjusting portion 108. The branch portion 107 also sets the first and second electrical signals in opposite phases. The FM laser element 102 is typically formed of a semiconductor laser element. With constant injection current, it oscillates a light at a wavelength λ1. When the injection current is amplitude-modulated by the first electrical signal, its output is modulated in optical intensity and also in oscillation wavelength (optical frequency), and it outputs an optical-frequency-modulated signal around the wavelength λ1. The first optical waveguide portion 103 guides the optical signal outputted from the FM laser element 102. The local light source 104 outputs light having a wavelength λ0, which is different from the oscillation wavelength λ1 of the FM laser element 102 by a given quantity Δλ. The second optical waveguide portion 105 guides the unmodulated light from the local light source 104. The second electrical signal outputted from the branch portion 107 is adjusted in propagation delay and in amplitude respectively in the delay adjusting portion 108 and the amplitude adjusting portion 109, and then is inputted to the IM suppressing laser element 110 and converted into an optical-intensity-modulated signal. The third optical wave guide portion 111 guides the optical-intensity-modulated signal outputted from the IM suppressing laser element 110. The three lights guided through the first optical waveguide portion 103, the second optical waveguide portion 105, and the third optical waveguide portion 111 are combined and inputted to the photodetection portion 106. The photodetection portion 106 performs heterodyne detection with its square-law detection characteristic to output a beat signal of the outputted optical signal from the FM laser element 102 and the outputted light from the local light source 104 at frequency corresponding to the wavelength difference Δλ between the two lights, and it also square-law detects the optical-intensity-modulated signal from the IM suppressing laser element 110 to convert it back into an electrical signal.

In the first embodiment, as described above, the electrical signal outputted from the signal source 101 is split into two and the two signals are set to be in opposite phases to each other. One of the signals is inputted to the FM laser element 102, and the other one is inputted to the IM suppressing laser element 110 to generate optical-intensity-modulated signal. The signals are then inputted to the photodetection portion 106 together with the unmodulated light from the local light source 104. Then the average-value variation component (IM-DD component) in the wide-band FM modulated signal produced as the beat between the outputted optical signal from the FM laser element 102 and the unmodulated light from the local light source 104 can be cancelled by the electrical signal obtained by square-law detecting the optical-intensity-modulated signal from the IM suppressing laser element 110. This enables generation of a wide-band FM modulated signal with reduced average-value variation component.

(2) Second Embodiment

Preferable settings in the delay adjusting portion 108 and the amplitude adjusting portion 109 in FIG. 1 will now be described as a second embodiment of the present invention.

Figure 2A:
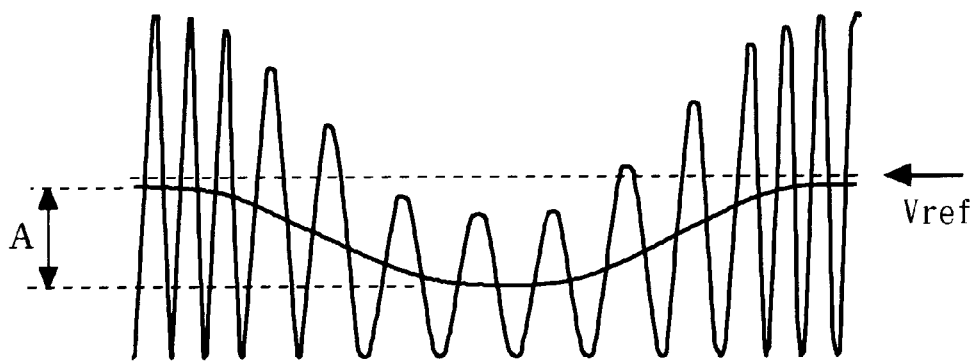
FIGS. 2a–2c are diagrams showing outputted signal waveforms presented by the photodetection portion in the first embodiment.
Figure 2B:

The delay adjusting portion 108 is set so that the quantities of propagation delays required for the first and second electrical signals outputted from the branch portion 107 to propagate through the respective propagation paths to reach the photodetection portion 106 coincide with each other. The amplitude adjusting portion 109 is set so that, as shown in FIG. 2, the magnitude A (refer to FIG. 2(a)) of the average-value variation component in the wide-band FM modulated signal and the amplitude B (refer to FIG. 2(b)) of the signal obtained by square-law detection of the optical-intensity-modulated signal from the IM suppressing laser element 110 coincide with each other in the photodetection portion 106.

Figure 2C:
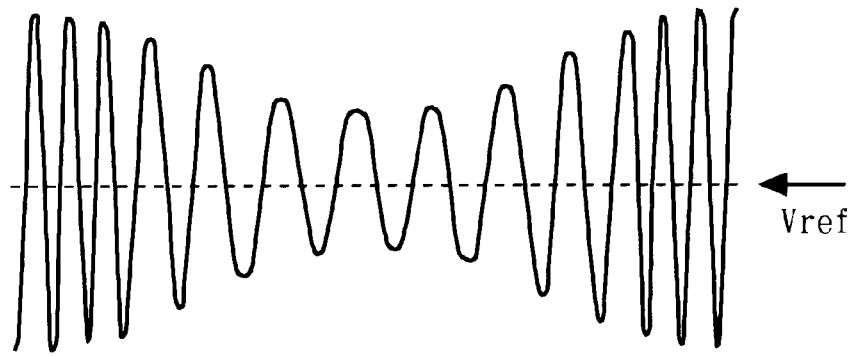
Figure 3:
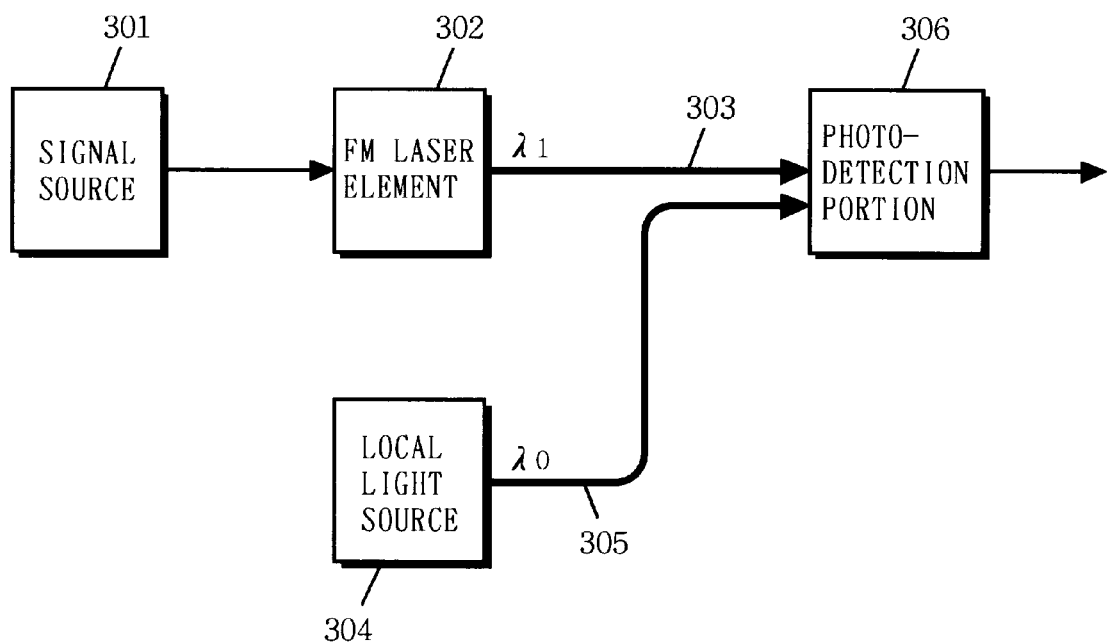
FIG. 3 is a block diagram showing a structure of a conventional FM modulation device.
Figure 4A:
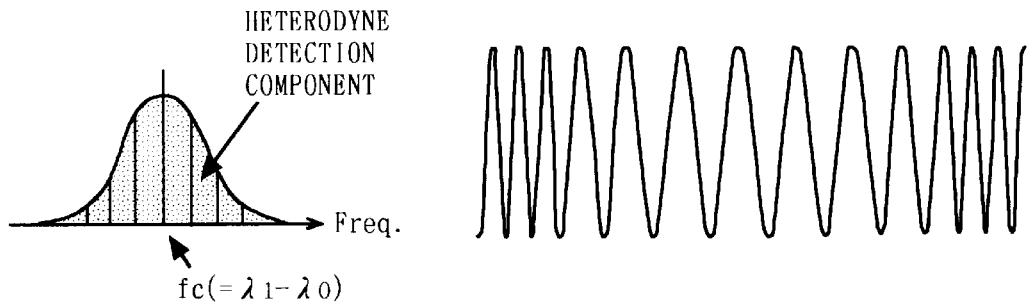
FIGS. 4a–4c are schematic diagrams used to describe the relation between spectrum and waveform of wide-band FM modulated signal produced by the conventional FM modulation device.
Figure 4B:
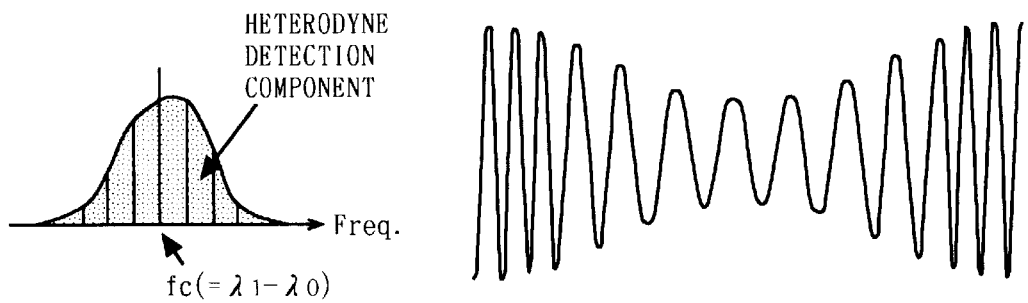
Figure 4C:
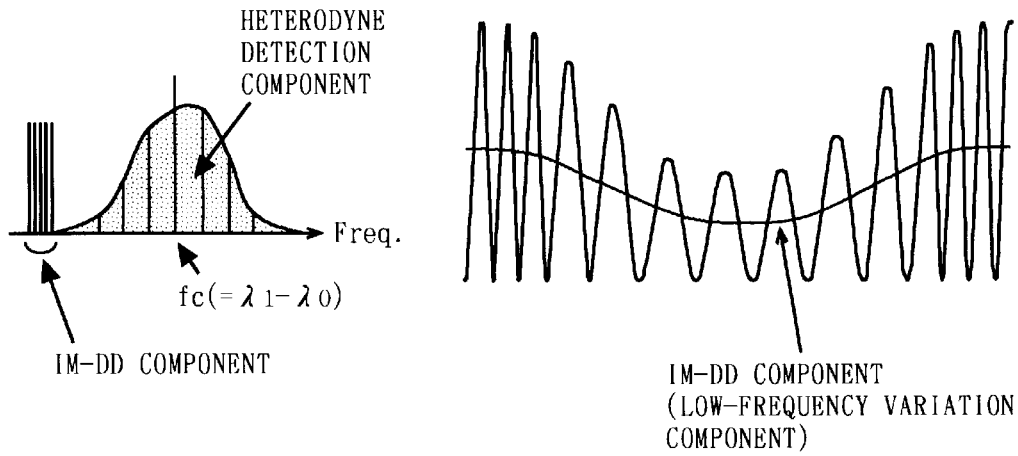
Figure 5:
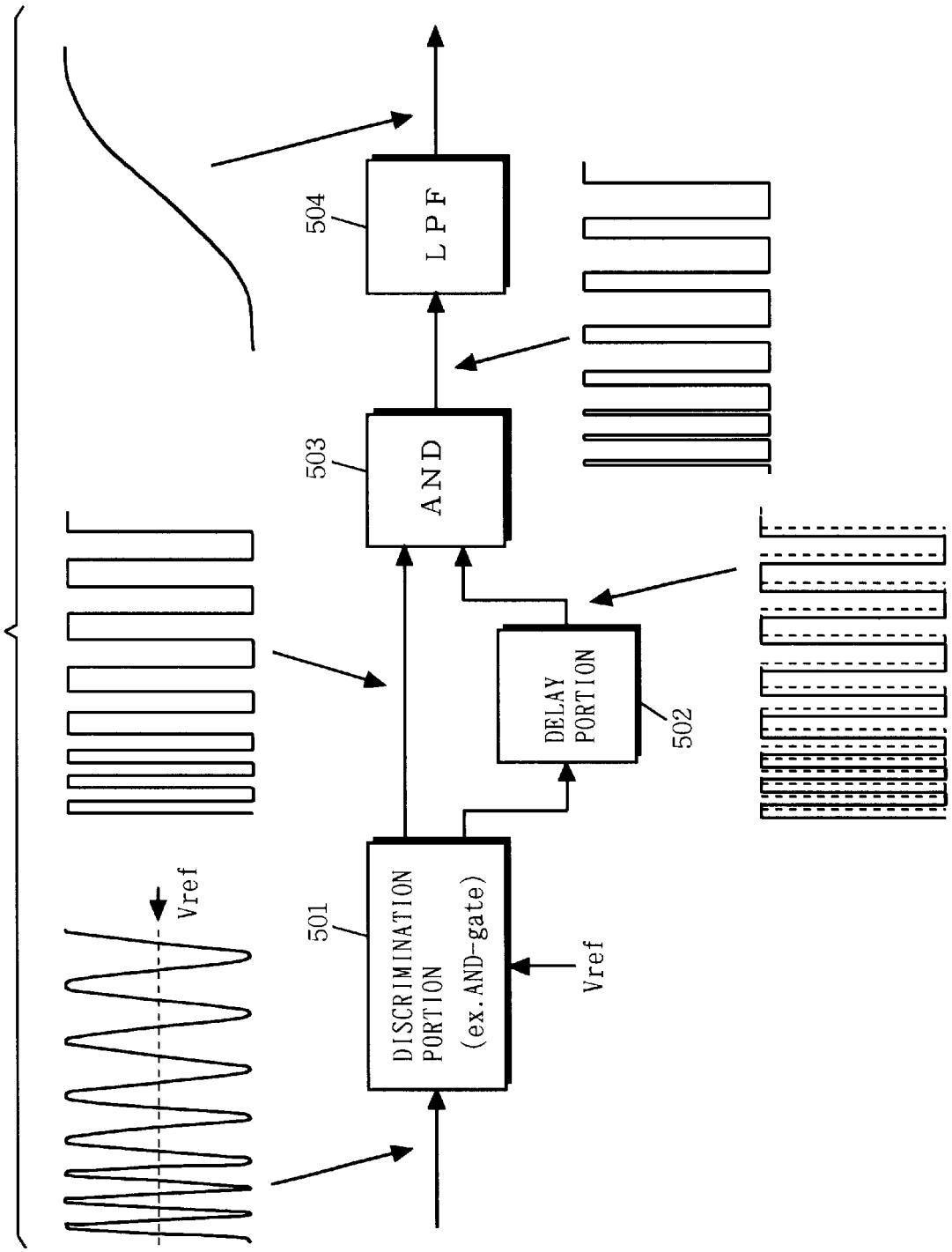
FIG. 5 is a block diagram showing the structure of a conventional typical FM demodulation circuit for demodulating the wide-band FM modulated signal.
Figure 6:
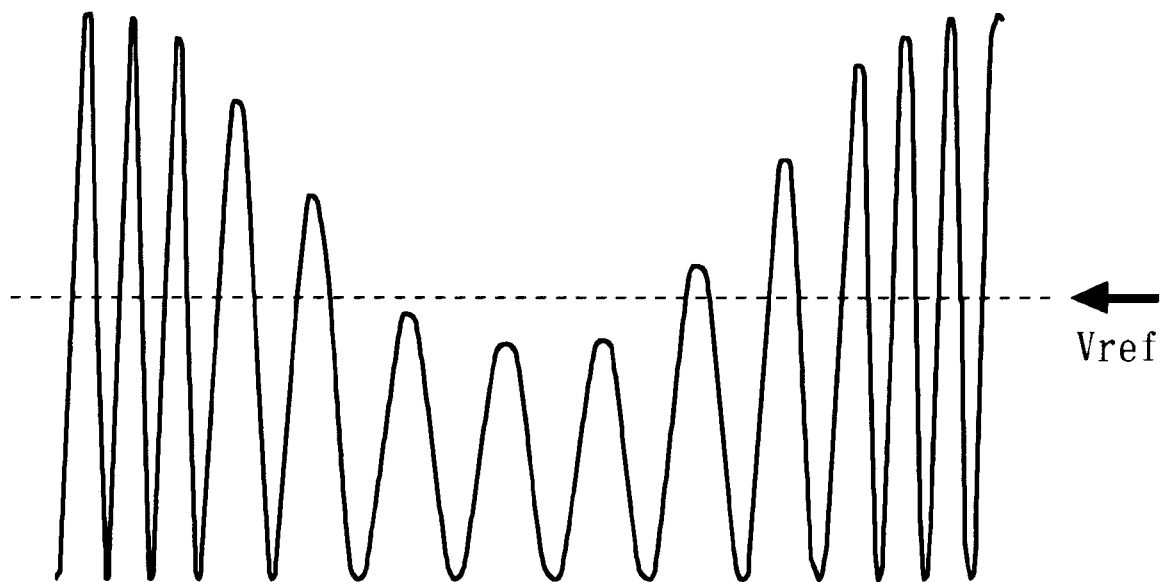
FIG. 6 is a diagram used to explain how the amplitude variation component and average-value variation component in the wide-band FM modulated signal affects the FM demodulation operation.

The settings above allows the average-value variation component in the wide-band FM modulated signal to be more certainly cancelled in the photodetection portion 106, thus producing a wide-band FM modulated signal without average-value variation (refer to FIG. 2(c)).

(3) Third Embodiment

A more preferable example of settings in FIG. 1 will be described as a third embodiment of the present invention.

The power coupling ratio of the outputted optical signal from the FM laser element 102 to the outputted optical signal from the IM suppressing laser element 110 inputted to the photodetection portion 106 is set to be n:1 (where n is a given positive real number). The optical intensity modulation index in the IM suppressing laser element 110 is set to be n times the optical intensity modulation index in the FM laser element 102. The above power coupling ratio can be adjusted by adjusting bias current inputted to the FM laser element 102 and/or the IM suppressing laser element 110, for example. It may be adjusted by providing an optical attenuator to follow the FM laser element 102 and/or the IM suppressing laser element 110 and adjusting the attenuation value of the optical attenuator.

When the relation of the power ratio between the optical signal from the FM laser element 102 and the optical signal from the IM suppressing laser element 110 inputted to the photodetection portion 106 and the optical intensity modulation indexes of the FM laser element 102 and the IM suppressing laser element 110 is clearly defined as described above, the magnitude of the average-value variation component in the wide-band FM modulated signal and the signal amplitude obtained by square-law-detecting the optical-intensity-modulated signal from the IM suppressing laser element 110 can more accurately coincide in the output from the photodetection portion 106. As a result, the average-value variation component in the wide-band FM modulated signal can be more certainly cancelled in the photodetection portion 106, so that an ideal wide-band FM modulated signal can be provided without average-value variation.

In the above-described first to third embodiments, it is desired that the oscillation wavelength $\lambda 2$ of the IM suppressing laser element 110 be sufficiently deviated from the oscillation wavelength $\lambda 1$ of the FM laser element 102 and the oscillation wavelength $\lambda 0$ of the local light source 104 so that the beat frequency of the outputted optical signal from the IM suppressing laser element 110 and the outputted optical signal from the FM laser element 102 and the beat frequency of the outputted optical signal from the IM suppressing laser element 110 and the outputted light from the local light source 104 will not agree with the beat frequency of the outputted optical signal from the FM laser element 102 and the outputted light from the local light source 104 at least. This prevents the beat signal produced between the IM suppressing laser element 110 and the FM laser element 102, or between the IM suppressing laser element 110 and the local light source 104 from interfering with the wide-band FM modulated signal, i.e., the beat signal produced between the FM laser element 102 and the local light source 104, to produce a wide-band FM modulated signal of good quality.

In the first to third embodiments described above, the delay adjusting portion 108 and the amplitude adjusting portion 109 are provided between the branch portion 107 and the IM suppressing laser element 110 to adjust the propagation delay and the amplitude of the second electrical signal. However, they may be provided between the branch portion 107 and the FM laser element 102 to adjust the propagation delay and the amplitude of the first electrical signal. In some cases, the delay adjusting portion 108 and the amplitude adjusting portion 109 may be omitted.

While the invention has been described in detail, the foregoing description is in all aspects illustrative and not restrictive. It is understood that numerous other modifications and variations can be devised without departing from the scope of the invention.

What is claimed is:

1. An FM modulation device comprising:
    a signal source for outputting an electrical signal;
    a branch portion for branching said electrical signal outputted from said signal source into a first electrical signal and a second electrical signal, said first electrical signal and said second electrical signal being set in opposite phases to each other;
    a laser light source for FM modulation (hereinafter referred to as an FM laser element) having the property of oscillating a light at a wavelength $\lambda 1$ in a steady state in which its inputted electrical signal remains constant, and also the property of uniquely converting a variation in amplitude of the inputted electrical signal into a variation in optical intensity and also uniquely into a variation in optical frequency, for converting said first electrical signal supplied as the inputted electrical signal into an optical signal and outputting the optical signal;
    a first optical waveguide portion for guiding the optical signal outputted from said FM laser element;
    a local light source for outputting a light at a wavelength $\lambda 0$ which is different from the oscillation wavelength $\lambda 1$ of said FM laser element by $\Delta \lambda$;
    a second optical waveguide portion for guiding the light outputted from said local light source;
    a laser light source for suppressing IM-DD component (hereinafter referred to as an IM suppressing laser element) having the property of uniquely converting a variation in amplitude of its inputted electrical signal into a variation in optical intensity, for converting said second electrical signal supplied as the inputted electrical signal into an optical signal having a wavelength $\lambda 2$ and outputting the optical signal;
    a third optical waveguide portion for guiding the optical signal outputted from said IM suppressing laser element; and
    a photodetection portion having the property of converting and outputting a variation in optical intensity of its inputted light as a variation in output current by a square-law detection characteristic (hereinafter referred to as IM-DD component), and also the property of, when two lights having different wavelengths are inputted, producing a beat component of the two lights at a frequency corresponding to a difference in wavelength between the two lights, for converting an optical intensity modulation component in the optical signal outputted from said FM laser element and the optical-intensity-modulated signal outputted from said IM suppressing laser element individually into variations in amplitude of the output current, and also outputting a beat signal of the optical signal outputted from said FM laser element and the light outputted from said local light source at a frequency corresponding to the wavelength difference $\Delta \lambda$ between the two lights.

2. The FM modulation device according to claim 1, further comprising,
    a delay adjusting portion for adjusting the propagation delay of at least one of said first and second electrical signals so that the propagation delay required for said first electrical signal outputted from said branch portion to enter said FM laser element, propagate through said first optical waveguide portion as the optical signal, and reach said photodetection portion, and the propagation delay required for said second electrical signal outputted from said branch portion to enter said IM suppressing laser element, propagate through said third optical waveguide portion as the optical signal, and reach said photodetection portion are equal to each other; and
    an amplitude adjusting portion for adjusting the amplitude of at least one of said first and second electrical signals so that the magnitude of the optical intensity modulation component in the optical signal outputted from said FM laser element and the magnitude of the optical-intensity-modulated signal outputted from said IM suppressing laser element are equal to each other in the amplitude of the outputted signal from said photodetection portion.

3. The FM modulation device according to claim 2, wherein a power coupling ratio of the optical signal outputted from said FM laser element and the optical signal outputted from said IM suppressing laser element, which are inputted to said photodetection portion, is set to n:1 (where n is a given positive real number), and said IM suppressing laser element has an optical intensity modulation index set to be n times the optical intensity modulation index of said FM laser element.

4. The FM modulation device according to claim 3, wherein the oscillation wavelength $\lambda 2$ of said IM suppressing laser element is sufficiently deviated from the oscillation wavelength $\lambda 1$ of said FM laser element and the oscillation wavelength $\lambda 0$ of said local light source so that a beat frequency resulting from the optical signal outputted from said IM suppressing laser element and the optical signal outputted from said FM laser element, and a beat frequency resulting from the optical signal outputted from said IM suppressing laser element and the light outputted from said local light source do not coincide with the beat frequency resulting from the optical signal outputted from said FM laser element and the light outputted from said local light source at least.

5. The FM modulation device according to claim 2, wherein the oscillation wavelength $\lambda 2$ of said IM suppressing laser element is sufficiently deviated from the oscillation wavelength $\lambda 1$ of said FM laser element and the oscillation wavelength $\lambda 0$ of said local light source so that a beat frequency resulting from the optical signal outputted from said IM suppressing laser element and the optical signal outputted from said FM laser element, and a beat frequency resulting from the optical signal outputted from said IM suppressing laser element and the light outputted from said local light source do not coincide with the beat frequency resulting from the optical signal outputted from said FM laser element and the light outputted from said local light source at least.

6. The FM modulation device according to claim 1, wherein a power coupling ratio of the optical signal outputted from said FM laser element and the optical signal outputted from said IM suppressing laser element, which are inputted to said photodetection portion, is set to n:1 (where n is a given positive real number), and said IM suppressing laser element has an optical intensity modulation index set to be n times the optical intensity modulation index of said FM laser element.

7. The FM modulation device according to claim 6, wherein the oscillation wavelength $\lambda 2$ of said IM suppressing laser element is sufficiently deviated from the oscillation wavelength $\lambda 1$ of said FM laser element and the oscillation wavelength $\lambda 0$ of said local light source so that a beat frequency resulting from the optical signal outputted from said IM suppressing laser element and the optical signal outputted from said FM laser element, and a beat frequency resulting from the optical signal outputted from said IM suppressing laser element and the light outputted from said local light source do not coincide with the beat frequency resulting from the optical signal outputted from said FM laser element and the light outputted from said local light source at least.

8. The FM modulation device according to claim 1, wherein the oscillation wavelength $\lambda 2$ of said IM suppressing laser element is sufficiently deviated from the oscillation wavelength $\lambda 1$ of said FM laser element and the oscillation wavelength $\lambda 0$ of said local light source so that a beat frequency resulting from the optical signal outputted from said IM suppressing laser element and the optical signal outputted from said FM laser element, and a beat frequency resulting from the optical signal outputted from said IM suppressing laser element and the light outputted from said local light source do not coincide with the beat frequency resulting from the optical signal outputted from said FM laser element and the light outputted from said local light source at least.

* * * * *